(12) United States Patent
Chang et al.

(10) Patent No.: US 11,024,718 B2
(45) Date of Patent: Jun. 1, 2021

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Chia-Ming Chang, Hsinchu (TW); Chi-Wen Liu, Hsinchu (TW); Cheng-Chien Li, Jhubei (TW); Hsin-Chieh Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/570,160

(22) Filed: Sep. 13, 2019

(65) Prior Publication Data

US 2020/0006498 A1  Jan. 2, 2020

Related U.S. Application Data

(60) Division of application No. 15/817,779, filed on Nov. 20, 2017, now Pat. No. 10,505,001, which is a
(Continued)

(51) Int. Cl.
*H01L 21/8234* (2006.01)
*H01L 29/36* (2006.01)
(Continued)

(52) U.S. Cl.
CPC ........ *H01L 29/36* (2013.01); *H01L 21/02532* (2013.01); *H01L 21/26506* (2013.01);
(Continued)

(58) Field of Classification Search
CPC ......... H01L 21/02381; H01L 21/02496; H01L 21/02505; H01L 21/0251; H01L 21/02532; H01L 21/823418
See application file for complete search history.

(56) References Cited

U.S. PATENT DOCUMENTS

| | | | |
|---|---|---|---|
| 6,888,195 B2 * | 5/2005 | Saito | H01L 29/0634 257/328 |
| 6,943,116 B2 | 9/2005 | Alsmeier et al. | |

(Continued)

FOREIGN PATENT DOCUMENTS

| | | |
|---|---|---|
| CN | 101211964 A | 7/2008 |
| CN | 103378156 A | 10/2013 |

(Continued)

*Primary Examiner* — Jae Lee
(74) *Attorney, Agent, or Firm* — Slater Matsil, LLP

(57) ABSTRACT

A semiconductor device includes a substrate, at least one semiconductor fin, and at least one epitaxy structure. The semiconductor fin is present on the substrate. The semiconductor fin has at least one recess thereon. The epitaxy structure is present in the recess of the semiconductor fin. The epitaxy structure includes a topmost portion, a first portion and a second portion arranged along a direction from the semiconductor fin to the substrate. The first portion has a germanium atomic percentage higher than a germanium atomic percentage of the topmost portion and a germanium atomic percentage of the second portion.

20 Claims, 11 Drawing Sheets

Related U.S. Application Data continuation of application No. 15/164,824, filed on May 25, 2016, now Pat. No. 10,032,873.

(60) Provisional application No. 62/218,901, filed on Sep. 15, 2015.

(51) Int. Cl.

| | | |
|---|---|---|
| *H01L 29/167* | (2006.01) | |
| *H01L 29/06* | (2006.01) | |
| *H01L 29/78* | (2006.01) | |
| *H01L 21/265* | (2006.01) | |
| *H01L 21/02* | (2006.01) | |
| *H01L 29/417* | (2006.01) | |
| *H01L 29/66* | (2006.01) | |

(52) U.S. Cl.
CPC ........ *H01L 29/0657* (2013.01); *H01L 29/167* (2013.01); *H01L 29/41791* (2013.01); *H01L 29/66795* (2013.01); *H01L 29/785* (2013.01); *H01L 29/7848* (2013.01)

(56) References Cited

U.S. PATENT DOCUMENTS

| | | |
|---|---|---|
| 7,667,271 B2 | 2/2010 | Yu et al. |
| 8,362,575 B2 | 1/2013 | Kwok et al. |
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 9,171,925 B2 | 10/2015 | Kuo et al. |
| 2006/0091490 A1* | 5/2006 | Chen ................... H01L 29/7391 257/458 |
| 2008/0157119 A1 | 7/2008 | Tsai |
| 2011/0068407 A1 | 3/2011 | Yeh et al. |
| 2013/0011983 A1 | 1/2013 | Tsai et al. |
| 2013/0187220 A1 | 7/2013 | Surthi |
| 2013/0280875 A1 | 10/2013 | Cheng et al. |
| 2014/0252412 A1 | 9/2014 | Tsai et al. |
| 2014/0252489 A1 | 9/2014 | Yu et al. |
| 2014/0264348 A1 | 9/2014 | Tsai et al. |
| 2014/0335674 A1* | 11/2014 | Liao ................... H01L 29/66636 438/285 |
| 2015/0048417 A1 | 2/2015 | Kwok et al. |
| 2015/0187664 A1* | 7/2015 | Joshi ....................... H01L 22/14 438/17 |
| 2015/0340453 A1* | 11/2015 | Cho .................... H01L 29/4966 257/330 |
| 2016/0027918 A1 | 1/2016 | Kim et al. |
| 2016/0118251 A1* | 4/2016 | Jacob ................ H01L 29/66628 438/478 |

FOREIGN PATENT DOCUMENTS

| | | |
|---|---|---|
| KR | 20140111575 A | 9/2014 |
| KR | 20160011742 A | 2/2016 |
| TW | 201508923 A | 3/2015 |

* cited by examiner

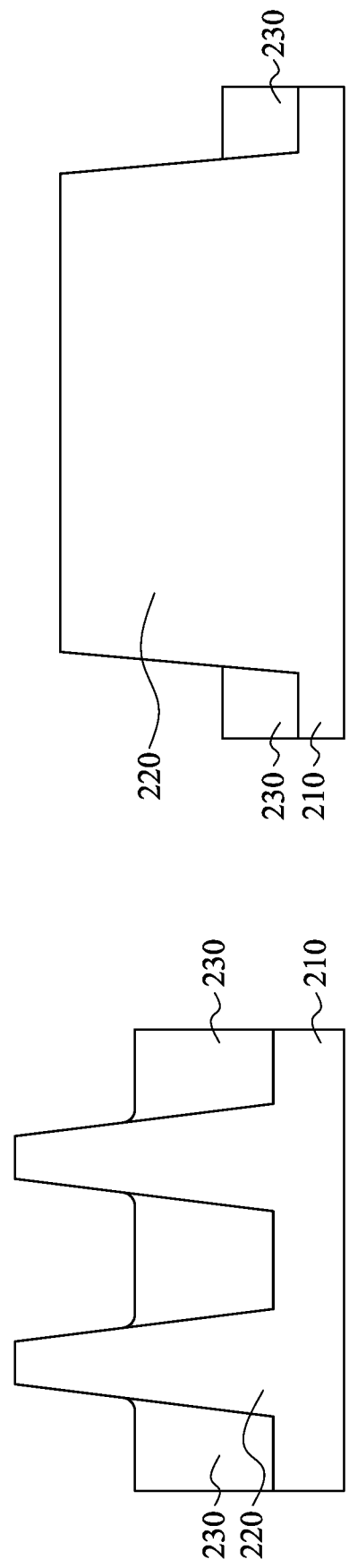

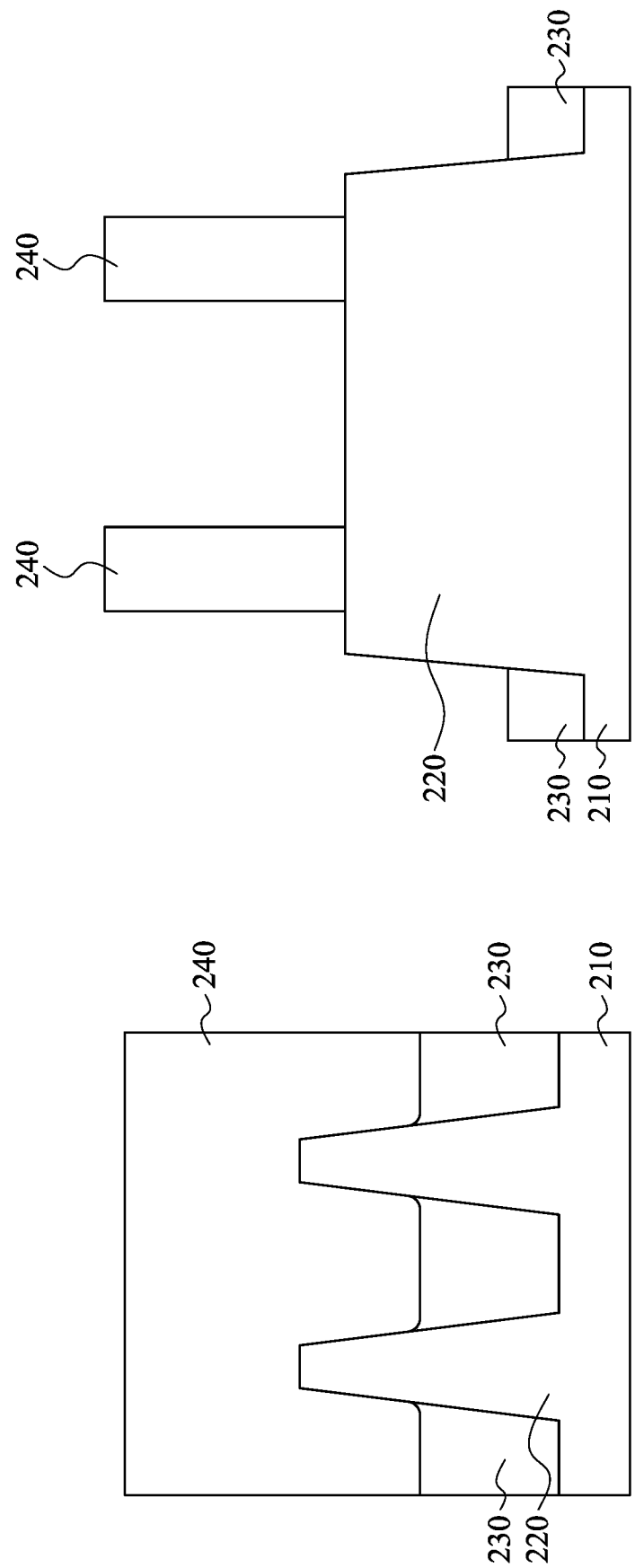

SEMICONDUCTOR DEVICE AND METHOD OF FORMING THE SAME

PRIORITY CLAIM AND CROSS-REFERENCE

This application is a division of U.S. patent application Ser. No. 15/817,779, filed Nov. 20, 2017, entitled "Semiconductor Device and Method of Forming the Same," which is a continuation of U.S. patent application Ser. No. 15/164,824, filed May 25, 2016, entitled "Semiconductor Device and Method of Forming the Same," now U.S. Pat. No. 10,032,873 issued on Jul. 24, 2018, which application claims priority to U.S. Provisional Application No. 62/218,901, filed Sep. 15, 2015, which applications are herein incorporated by reference.

BACKGROUND

In the race to improve transistor performance as well as reduce the size of transistors, transistors have been developed that the channel and source/drain regions are located in a fin formed from the bulk substrate. Such non-planar devices can be referred to as multiple-gate finFETs. A multiple-gate finFET may have a gate electrode that straddles across a fin-like silicon body to form a channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A to 12A are cross-sectional views of a method of forming a semiconductor device at various stages in accordance with some embodiments taken along a line, such as the line parallel to a lengthwise direction of the gate structure in FIG. 1.

FIGS. 5B to 12B are different cross-sectional views corresponding to FIG. 5A to 12A which is taken along a line, such as line 2 in FIG. 1.

DETAILED DESCRIPTION

Figure 1:
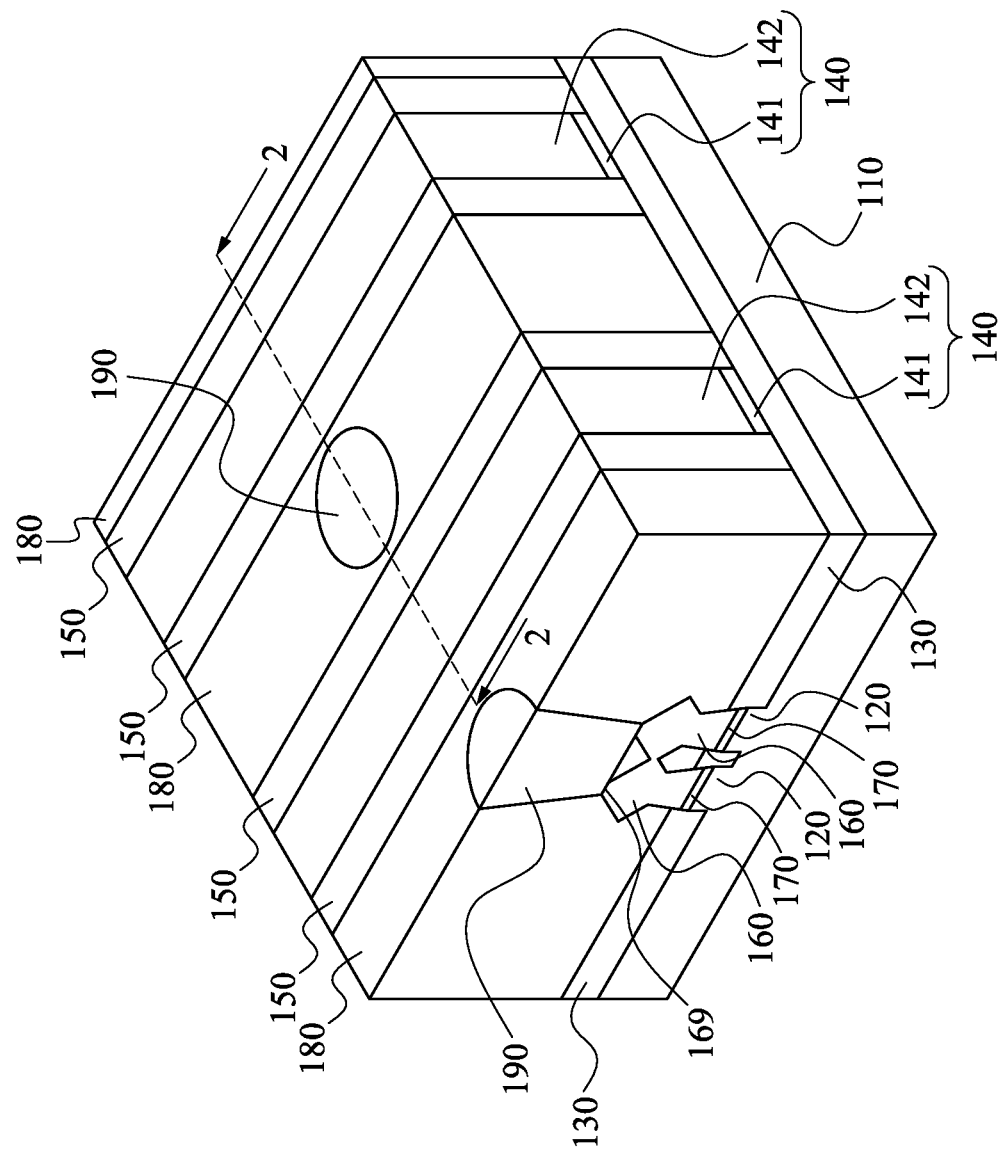
FIG. 1 is a perspective view of an exemplary semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the some embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Source and drain regions of a finFET may be formed on the semiconductor fin by epitaxy growth. Embodiments of the present disclosure provide some improved epitaxy source and drain regions. These embodiments are discussed below in the context of forming the semiconductor device having a single semiconductor fin or multiple fins on a bulk silicon substrate. One of ordinary skill in the art will realize that embodiments of the present disclosure may be used with other configurations.

FIG. 1 is a perspective view of an exemplary semiconductor device according to some embodiments. The semiconductor device includes a substrate 110. In some embodiments, the substrate 110 includes a bulk silicon substrate. In some embodiments, the substrate 110 may be silicon in a crystalline structure. In some other embodiments, the substrate 110 may include other elementary semiconductors, such as germanium, or include a compound semiconductor, such as silicon carbide, gallium arsenide, indium arsenide, or indium phosphide. In yet some other embodiments, the substrate 110 includes a silicon-on-insulator (SOI) substrate. The SOI substrate may be fabricated using separation by implantation of oxygen, wafer bonding, and/or other suitable methods.

The semiconductor device further includes shallow trench isolation (STI) structures 130 surrounding the semiconductor fin 120. The STI structures 130 may include any suitable insulating material, such as silicon oxide. In some embodiments, the STI structure 130 has a thickness ranging from, for example, about 30 nm to about 60 nm.

The semiconductor device 100 further includes at least one gate structure 140. The gate structure 140 is formed on a portion of the semiconductor fin 120. The gate structure 140 includes a gate dielectric layer 141 and a gate electrode layer 142. The gate dielectric layer 141 is present between the gate electrode layer 144 and the substrate 110, and is formed on the semiconductor fin 120. The gate dielectric layer 141, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (La- SiO), aluminum silicon oxide (AlSiO), aluminum oxide (Al₂O₃), silicon nitride (Si₃N₄), oxynitrides (SiON), and combinations thereof. The gate dielectric layer 141 may have a multilayer structure such as one layer of silicon oxide (e.g., interfacial layer) and another layer of high-k material.

The gate electrode layer 142 is formed over the substrate 110 to cover the gate dielectric layer 141 and the portion of the semiconductor fin 120 covered by the gate dielectric layer 141. In some embodiments, the gate electrode layer 142 includes a semiconductor material such as polysilicon, amorphous silicon, or the like. The gate electrode layer 142 may be deposited doped or undoped. For example, in some embodiments, the gate electrode layer 142 includes polysilicon deposited undoped by low-pressure chemical vapor deposition (LPCVD). Once applied, the polysilicon may be doped with, for example, phosphorus ions (or other n-type dopants) or boron (or other p-type dopants) based on the type of the semiconductor device. The polysilicon may also be deposited, for example, by furnace deposition of an in-situ doped polysilicon. Alternatively, the gate electrode layer 142 may include a polysilicon metal alloy or a metal gate including metals such as tungsten (W), nickel (Ni), aluminum (Al), tantalum (Ta), titanium (Ti), or any combination thereof.

The semiconductor fin 120 includes a channel region (not shown) covered and wrapped by the gate structure 140. The semiconductor fin 120 may be doped to provide a suitable channel for an n-type finFET (NMOS device) or p-type finFET (PMOS device). The semiconductor fin 120 may be doped using processes such as, ion implantation, diffusion, annealing, and/or other suitable processes.

The semiconductor device further includes a pair of spacers 150. The spacers 150 are respectively formed over the substrate 110 and adjacent to opposite sides of the gate structure 140. Portions of the semiconductor fin 120 are covered by the spacers 150. In some embodiments, the spacer 150 may include silicon oxide, silicon nitride, silicon oxynitride, or other suitable material. The spacer 150 may include a single layer or multilayer structure.

Figure 2:
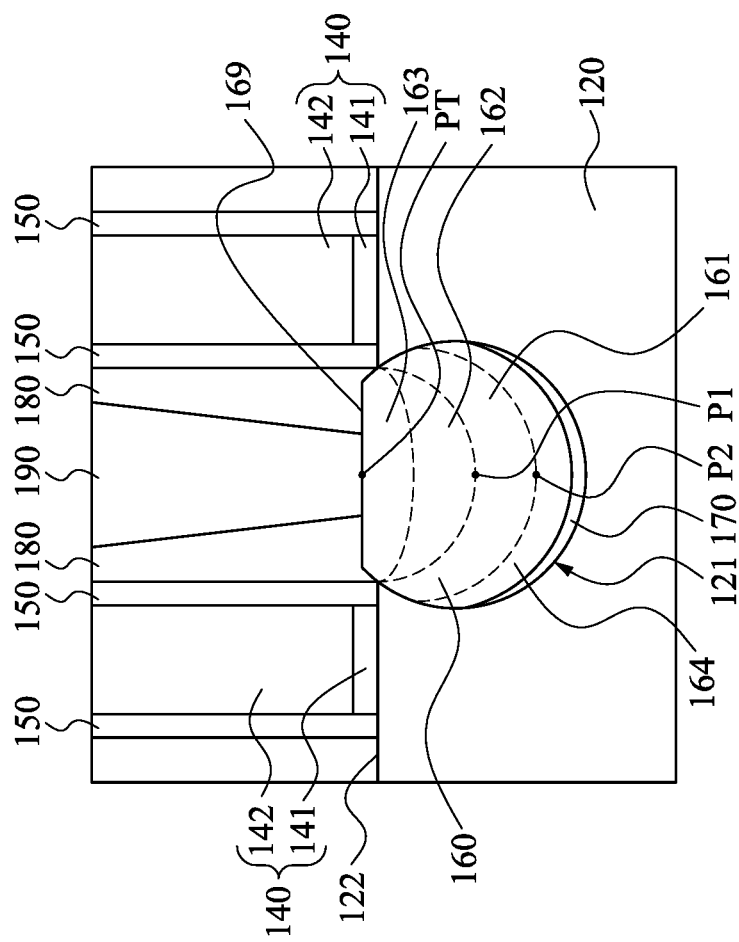
FIG. 2 is a cross-sectional view of the semiconductor device in FIG. 1 taken along 2-2 line.

Reference is made to FIG. 2, which is a cross-sectional view taken along line 2 in FIG. 1. The semiconductor fin 120 includes at least one recess 121 between the spacers 150. The recess 121 is formed on the portions of the semiconductor fin 120 that are not covered by the spacers 150 and the gate structure 140. More particularly, a portion of the semiconductor fin 120 exposed both by the gate structure 140 and the spacers 150 is partially removed (or partially recessed) to form a recess 121 in semiconductor fin 120.

The semiconductor device further includes at least one epitaxy structure 160. The epitaxy structure 160 is formed on the semiconductor fin 120. More particularly, the epitaxy structure 160 is formed in the recess 121 of the semiconductor fin 120. In some embodiments, the semiconductor fin 120 has a topmost surface 122. The epitaxy structure 160 extends below the topmost surface 122 toward the substrate 110. In some embodiments, a plurality of epitaxy structures 160 may be epitaxially grown on the semiconductor fins 120 respectively. Because epitaxy growth includes vertical growth and horizontal growth, a portion of one epitaxy structure 160 grown from the semiconductor fin 120 eventually merges with a portion of the epitaxy structure 160 grown from the neighboring semiconductor fin 120. As such, the epitaxy structures 160 formed on different semiconductor fins 120 may be merged into a continuous epitaxy structure, which may benefit a source/drain to be formed thereon.

The epitaxy structure 160 may be formed by using one or more epitaxy or epitaxial (epi) processes, such that Si features, SiGe features, and/or other suitable features can be formed in a crystalline state on the semiconductor fin 120. In some embodiments, a lattice constant of the epitaxy structure 160 is different from a lattice constant of the channel of the semiconductor fin 120, so that the channel can be strained or stressed by the epitaxy structure 160 to improve carrier mobility of the semiconductor device and enhance the device performance.

The semiconductor device further includes an interlayer dielectric (ILD) layer 180. The ILD layer 180 is formed on the substrate 110 to cover the epitaxy structure 160. The ILD layer 180 may include silicon oxide, silicon nitride, silicon oxynitride, silicon carbide, a low-dielectric constant dielectric material, or combinations thereof.

The semiconductor device further includes a source/drain contact 190. The source/drain contact 190 is formed through the ILD layer 180 and contacts with a top surface 169 of the epitaxy structure 160. In some embodiments, the source/drain contact 190 includes W, Co, Cu, Al or other suitable conductive material. As shown in FIG. 1, when the epitaxy structures 160 formed on different semiconductor fins 120 are merged into a continuous epitaxy structure, the source/drain contact 190 can be formed on these epitaxy structures 160.

In some embodiments, the epitaxy structure 160 is a germanium-containing structure. For example, the epitaxy structure 160 may include silicon germanium. The epitaxy structure 160 may be formed using chemical vapor deposition (CVD). The precursors may include silicon-containing gases and germanium-containing gases, such as SiH₄ and GeH₄, respectively, and the partial pressures of the silicon-containing gases and germanium-containing gases are adjusted to modify the germanium atomic percentage and the silicon atomic percentage. In some embodiments, the resulting epitaxy structure 160 includes a topmost portion PT, a first portion P1 and a second portion P2. The top portion PT, the first portion P1 and the second portion P2 are arranged along a direction from the semiconductor fin 120 to the substrate 110. The first portion P1 has a germanium atomic percentage higher than a germanium atomic percentage of the topmost portion PT and a germanium atomic percentage of the second portion P2. In other words, both the topmost portion PT above the first portion P1 and the second portion P2 below the first portion P1 contain less germanium than the first portion P1, which may benefit the resulting epitaxy structure 160 to have a top surface 169 in a suitable size and shape, and may benefit the source/drain contact 190 formed thereon. In some embodiments, the ratio of the flow rate of the germanium-containing gas, such as GeH₄, to the flow rate of the silicon-containing gas, such as SiH₄, may be controlled or tuned to form the foregoing germanium atomic percentage of the topmost portion PT, the first portion P1 and the second portion P2 during the epitaxy growth of the epitaxy structure 160. In some embodiments, the germanium atomic percentage may be referred to as the germanium concentration.

In some embodiments, the epitaxy structure 160 includes a middle buried layer 161 between the first portion P1 and the second portion P2. The germanium atomic percentage of the middle buried layer 161 increases along a direction from the substrate 110 to the semiconductor fin 120. In other words, the germanium atomic percentage of the middle buried layer 161 increases along a direction from the second portion P2 to the first portion P1. This may benefit the top surface 169 of the epitaxy structure 160 to be formed in a suitable size and shape for benefiting formation of the source/drain contact 190. In some embodiments, the middle buried layer 161 is a gradient germanium-containing layer, in which the germanium atomic percentage is increasingly graded upwardly. In some embodiments, the bottommost location of the middle buried layer 161 (namely, the second portion P2) has a germanium atomic percentage ranging from about 25% to about 55%, and the germanium atomic percentage of other location of the middle buried layer 161 above the bottommost location increases upwardly. In some embodiments, the ratio of the flow rate of the germanium-containing gas, such as $GeH_4$, to the flow rate of the silicon-containing gas, such as $SiH_4$, may be controlled or tuned to form the foregoing gradient germanium atomic percentage of the middle buried layer 161 during the epitaxy growth of the middle buried layer 161.

In some embodiments, the epitaxy structure 160 further includes an upper buried layer 162. The upper buried layer 162 is located between the middle buried layer 161 and the topmost portion PT. The upper buried layer 162 has a germanium atomic percentage decreasing along a direction from the substrate 110 to the semiconductor fin 120. In other words, the germanium atomic percentage of the upper buried layer 162 decreases along a direction from the first portion P1 to the topmost portion PT. This may benefit formation of the topmost portion PT that contains less germanium than the middle buried layer 161. In some embodiments, the upper buried layer 162 is a gradient germanium-containing layer, in which the germanium atomic percentage is decreasingly graded upwardly. In some embodiments, the bottommost location of the upper buried layer 162 (namely, the first portion P1) has a germanium atomic percentage ranging from about 45% to about 55%, and the germanium atomic percentage of other location of the upper buried layer 162 above the bottommost location decreases upwardly. In some embodiments, the ratio of the flow rate of the germanium-containing gas, such as $GeH_4$, to the flow rate of the silicon-containing gas, such as $SiH_4$, may be controlled or tuned to form the foregoing gradient germanium atomic percentage of the upper buried layer 162 during the epitaxy growth of the upper buried layer 162.

In some embodiments, the epitaxy structure 160 further includes a topmost layer 163. The topmost portion PT is located on a topmost surface of the topmost layer 163 opposite to the underlying upper and middle buried layers 162 and 161. In other words, the upper buried layer 162 is located between the topmost layer 163 and the middle buried layer 161. The topmost layer 163 has a germanium atomic percentage lower than the germanium atomic percentage of the middle buried layer 161. The germanium atomic percentage of the topmost layer 163 at least partially decreases along the direction from the substrate 110 to the semiconductor fin 120. In particular, the germanium atomic percentage of at least an upper portion of the topmost layer 163 decreases upwardly, which may benefit formation of the topmost portion PT that contains less germanium than other underlying location of the topmost layer 163. In some embodiments, the germanium atomic percentage of the topmost layer 163 ranges from about 15% to about 25%. In some embodiments, a maximal germanium atomic percentage of the topmost layer 163 is in a range between a minimal germanium atomic percentage and a maximal germanium atomic percentage of the upper buried layer 162. In other words, a lower portion of the topmost layer 163 immediately adjacent to the upper buried layer 162 may has a germanium atomic percentage that increases along the direction from the substrate 110 to the semiconductor fin 120 to reach the maximal germanium atomic percentage of the topmost layer 163, while the germanium atomic percentage of the upper portion of the topmost layer 163 decreases along the same direction to reach the minimal germanium atomic percentage of the topmost layer 163. In some embodiments, the ratio of the flow rate of the germanium-containing gas, such as $GeH_4$, to the flow rate of the silicon-containing gas, such as $SiH_4$, may be controlled or tuned to form the foregoing germanium atomic percentage profile of the topmost layer 163 during the epitaxy growth of the topmost layer 163.

In some embodiments, the epitaxy structure 160 further includes a lower buried layer 164. The lower buried layer 164 underlies the second portion P2. The germanium atomic percentage of the second portion P2 is in a range between a maximal germanium atomic percentage and a minimal germanium atomic percentage of the lower buried layer 164. This may benefit the top surface 169 of the epitaxy structure 160 to be formed in a suitable size and shape for benefiting formation of the source/drain contact 190. In other words, the germanium atomic percentage of the lower buried layer 164 is spatially various, and the maximal germanium atomic percentage thereof is higher than the germanium atomic percentage of the second portion P2, and the minimal germanium atomic percentage of the lower buried layer 164 is lower than the germanium atomic percentage of the second portion P2. In some embodiments, the germanium atomic percentage of the lower buried layer 164 ranges from about 25% to about 35%. In some embodiments, the ratio of the flow rate of the germanium-containing gas, such as $GeH_4$, to the flow rate of the silicon-containing gas, such as $SiH_4$, may be controlled or tuned to form the foregoing germanium atomic percentage profile of the lower buried layer 164 during the epitaxy growth of the lower buried layer 164.

In some embodiments, the semiconductor device further includes a doped layer 170. The doped layer 170 underlies the epitaxy structure 160. In other words, the doped layer 170 is located below the epitaxy structure 160. The epitaxy structure 160 is conformally formed on the doped layer 170. The doped layer 170 may be formed by doping a suitable p-type impurity, such as boron, into the semiconductor fin 120 through the surface of the recess 121. The doped layer 170 underlies the lower buried layer 164. The doped layer 170 has a germanium atomic percentage increasing along the direction from the substrate 110 to the semiconductor fin 120. In other words, the germanium atomic percentage of the doped layer 170 decreases downwardly. This may benefit the top surface 169 of the epitaxy structure 160 to be formed in a suitable size and shape for benefiting formation of the source/drain contact 190. In some embodiments, the ratio of the flow rate of the germanium-containing gas, such as $GeH_4$, to the flow rate of the silicon-containing gas, such as $SiH_4$, may be controlled or tuned to form the foregoing germanium atomic percentage profile of the doped layer 170 during the formation of the doped layer 170.

Figures 3, 4:
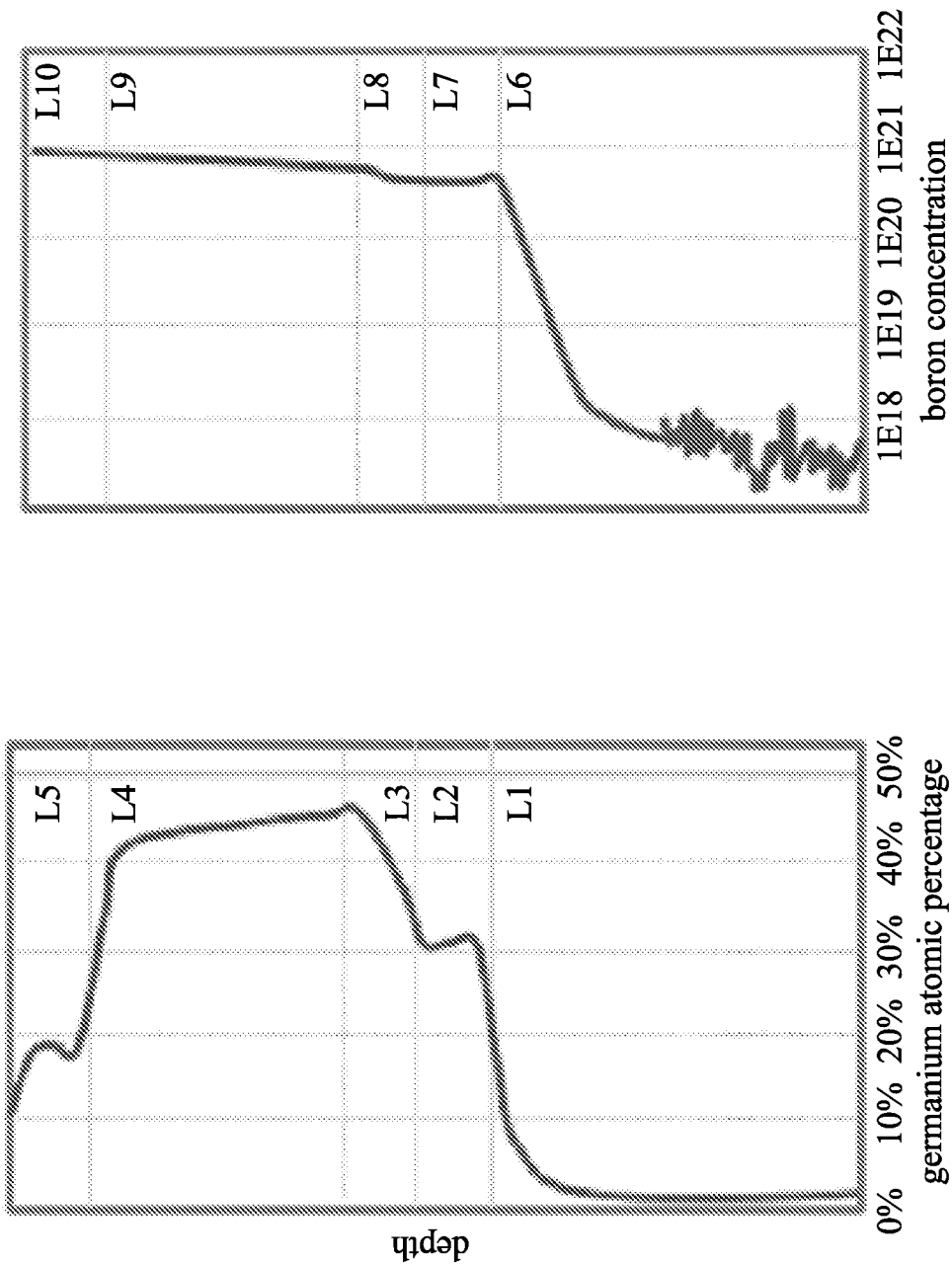
FIG. 3 is a germanium atomic percentage profile in accordance with some embodiments.
FIG. 4 is a boron concentration profile in accordance with some embodiments.

FIG. 3 is a germanium atomic percentage profile in accordance with some embodiments. In FIG. 3, a profile L1 is the germanium atomic percentage profile of the doped layer 170; a profile L2 is the germanium atomic percentage profile of the lower buried layer 164; a profile L3 is the germanium atomic percentage profile of the middle buried layer 161; a profile L4 is the germanium atomic percentage profile of the upper buried layer 162; and a profile L5 is the germanium atomic percentage profile of the topmost layer 163. By such an epitaxy structure 160 and doped layer 170 having such germanium atomic percentage profiles L1-L5, the top surface 169 of the epitaxy structure 160 can be formed in a suitable size and shape to benefit the source/ drain contact 190 formed thereon. The ratio of the flow rate of the germanium-containing gas, such as $GeH_4$, to the flow rate of the silicon-containing gas, such as $SiH_4$, may be controlled or tuned to form the germanium atomic percentage profiles L1-L5 during the formation of the epitaxy structure 160 and doped layer 170.

The epitaxy structure 160 is doped with a suitable impurity to serve as a source region or a drain region of the semiconductor device. In some embodiments, the epitaxy structure 160 is doped with a p-type impurity, such as boron, and the boron concentration of the epitaxy structure 160 is spatially various. In other words, the boron concentration of the epitaxy structure 160 is unevenly distributed. In some embodiments, the concentration of the p-type impurity is correlated to the dose of the p-type dopant used in the implantation process, and therefore, the dose of the boron dopant may be controlled or tuned to form the spatially various boron concentration of the epitaxy structure 160. The boron-doped epitaxy structure 160 may serve as a p-type source/drain region. Therefore, the semiconductor device may serve as a p-type finFET.

In some embodiments, the boron concentration of the epitaxy structure 160 substantially increases from the doped layer 170 to the topmost layer 163. In other words, a boron concentration of the doped layer 170 is lower than a boron concentration of the lower buried layer 164. The boron concentration of the lower buried layer 164 is lower than a boron concentration of the middle buried layer 161. The boron concentration of the middle buried layer 161 is lower than a boron concentration of the upper buried layer 162. The boron concentration of the upper buried layer 162 is lower than a boron concentration of the topmost layer 163. In some embodiments, the boron concentration of the doped layer 170 oscillates along a direction from the substrate 110 to the semiconductor fin 120. For example, reference is made to FIG. 4, which is a boron concentration profile in accordance with some embodiments. In FIG. 4, a profile L6 is the boron concentration profile of the doped layer 170; a profile L7 is the boron concentration profile of the lower buried layer 164; a profile L8 is the boron concentration profile of the middle buried layer 161; a profile L9 is the boron concentration profile of the upper buried layer 162; and a profile L10 is the boron concentration profile of the topmost layer 163. By such a boron-doped epitaxy structure 160 and boron-doped layer 170 having such boron concentration profiles L6-L10, the top surface 169 of the epitaxy structure 160 can be formed in a suitable size and shape to benefit the source/drain contact 190 formed thereon. The dose of the boron dopant used in the implantation process may be controlled or tuned to implement the boron concentration profiles L6 to L10. In some embodiments, the boron concentration of the doped layer 170 ranges from about 1e17 $cm^{-3}$ to about 1e21 $cm^{-3}$, and the boron concentration of the lower buried layer 164 ranges from about 3e20 $cm^{-3}$ to about 5e20 $cm^{-3}$, and the boron concentration of the middle buried layer 161 ranges from about 6e20 $cm^{-3}$ to about 10e20 $cm^{-3}$, and the boron concentration of the upper buried layer 162 ranges from about 6e20 $cm^{-3}$ to about 10e20 $cm^{-3}$, and the boron concentration of the topmost layer 163 ranges from about 8e20 $cm^{-3}$ to about 11e20 $cm^{-3}$.

In some embodiments, the resulting boron-doped epitaxy structure 160 has a depth ranging from about 45 nm to about 65 nm. The top surface 169 of the resulting boron-doped epitaxy structure 160 may be higher than the topmost surface 122 of the semiconductor fin 120, and the vertical distance from the top surface 169 to the topmost surface 122 may be 5 nm. In other words, a portion of the epitaxy structure 160 is formed in excess of the recess 121, which may benefit formation of the source/drain contact 190. In some embodiments, the topmost layer 163 may have a thickness ranging from about 2.7 nm to about 7.5 nm, and a maximal width of other portion of the epitaxy structure 160 except the topmost layer 163 may range from about 35 nm to about 55 nm. This maximal width is measured along an arrangement direction of the epitaxy structures 160, as shown in FIG. 1.

FIGS. 5A to 12A are cross-sectional views of a method of forming a semiconductor device at various stages in accordance with some embodiments taken along a line, such as the line parallel to a lengthwise direction of the gate structure 140 in FIG. 1. FIGS. 5B to 12B are different cross-sectional views corresponding to FIG. 5A to 12A which is taken along a line, such as line 2 in FIG. 1.

Reference is made to FIGS. 5A and 5B. A semiconductor fin 220 is formed in the substrate 210, and a portion of the semiconductor fin 220 is protruded from the substrate 210. The semiconductor fin 220 may be formed by, for example, patterning and etching the substrate 210 using photolithography techniques. In some embodiments, a layer of photoresist material (not shown) is deposited over the substrate 210. The layer of photoresist material is irradiated (exposed) in accordance with a desired pattern (the semiconductor fin 220 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In FIGS. 5A and 5B, a plurality of STI structures 230 are formed on the substrate 210. The STI structures 230 may be formed by chemical vapor deposition (CVD) techniques using tetra-ethyl-ortho-silicate (TEOS) and oxygen as a precursor. In some other embodiments, the STI structures 230 may be formed by implanting ions, such as oxygen, nitrogen, carbon, or the like, into the substrate 210. In yet some other embodiments, the STI structures 230 are insulator layers of a SOI wafer.

Reference is made to FIGS. 6A and 6B. Dummy gate structures 240 are formed on portions of the semiconductor fin 220 at an interval and expose another portion of the semiconductor fin 220. The dummy gate structures 240 include polysilicon, and they can be formed by a deposition process, such as a CVD process.

Figure 7A:
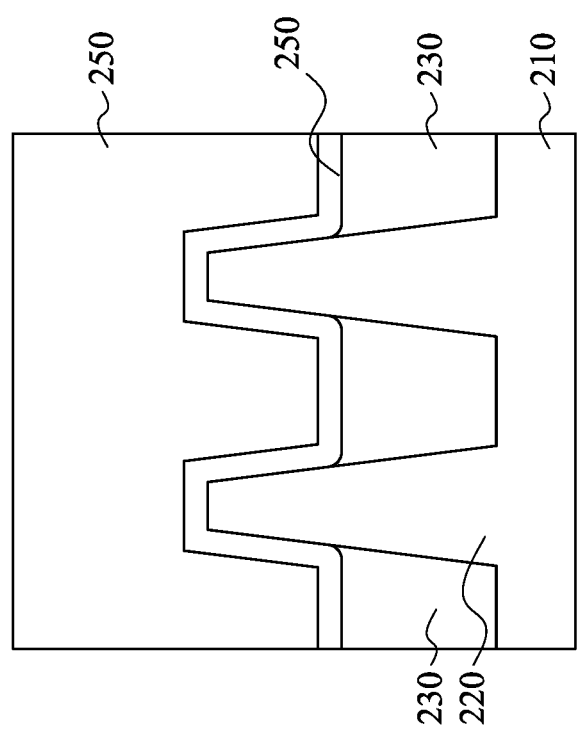
Figure 7B:
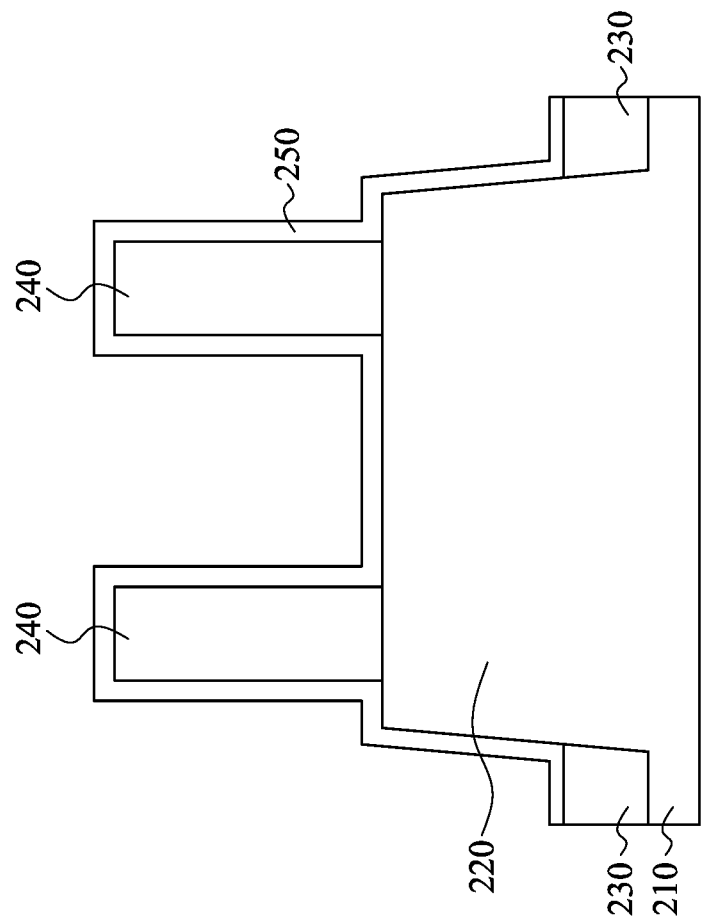

Reference is made to FIGS. 7A and 7B. A dielectric layer 250 is conformally formed over the semiconductor fin 220 and the dummy gate structures 240. In some embodiments, the dielectric layer 250 may include silicon oxide, silicon nitride, silicon oxy-nitride, or other suitable material. The dielectric layer 250 may include a single layer or multilayer structure. The dielectric layer 250 may be formed by a deposition process, such as an atomic layer deposition (ALD) process, a CVD process, a PVD process or a sputter deposition process or other suitable techniques.

Figure 8B:
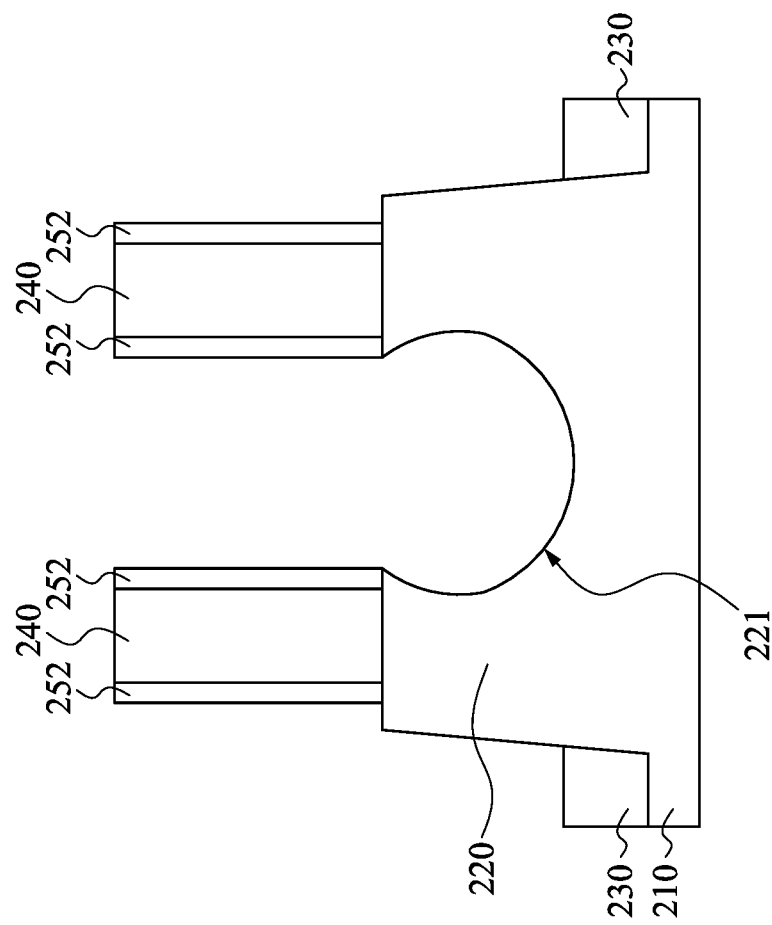
Figure 8A:
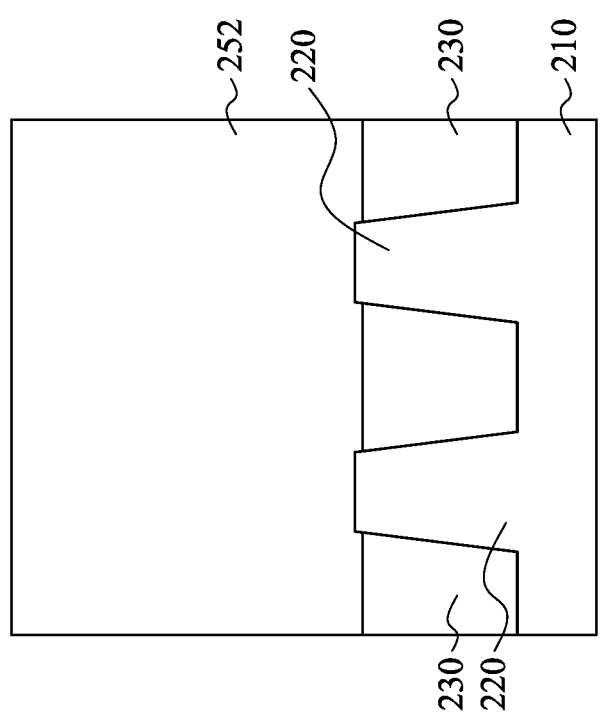

Reference is made to FIGS. 8A and 8B. A removal process is performed to remove portions of the dielectric layer 250 and portions of the underlying semiconductor fins 220, so that portions of the semiconductor fin 220 is exposed. This removal process may form an exposed recess 221 on each semiconductor fin 220, as shown FIG. 8B. Some remaining portions of the dielectric layer 250 serve as a pair of spacers 252 located on two opposite sides of the dummy gate structure 240, as shown in FIG. 8B. In some embodiments, the spacers 252 may be used to offset subsequently formed epitaxy structure formed in the recess 221. The spacers 252 may further be used for designing or modifying the profile of the epitaxy structure.

The removal process may be a dry etching process, a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recess 221 with HF or other suitable solution, which benefit the subsequent epitaxy growth.

Figure 9B:
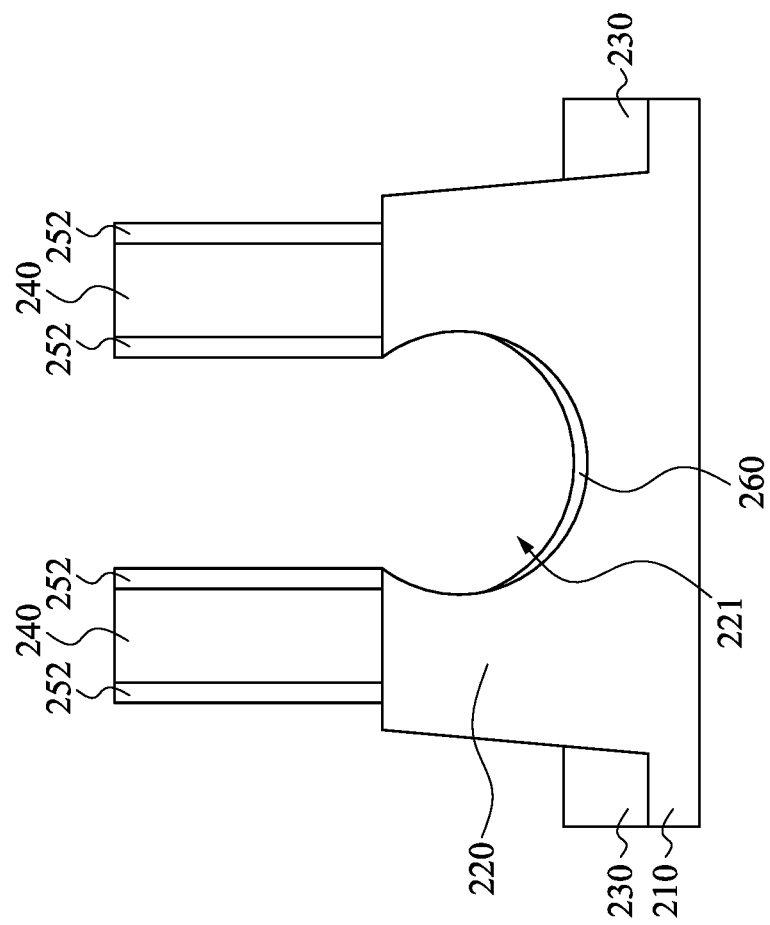
Figure 9A:
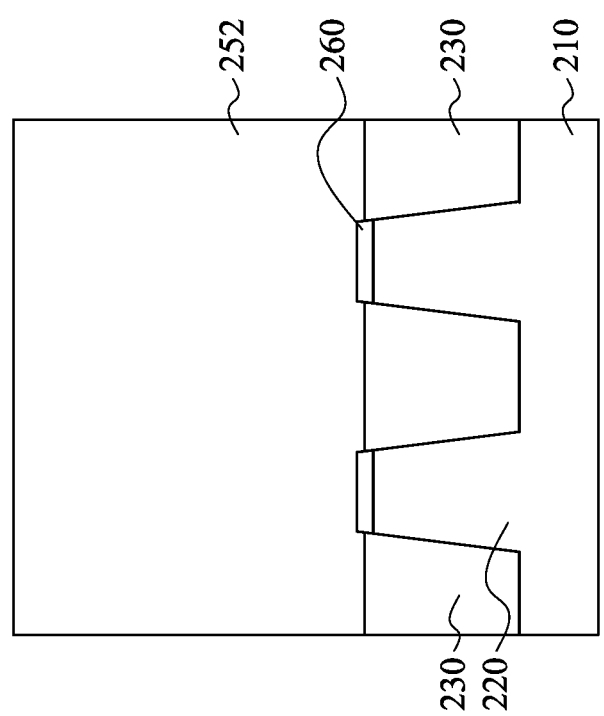

Reference is made to FIGS. 9A and 9B. A doped layer 260 may be formed in the recess 221 of the semiconductor fin 220. The doped layer 260 is doped with a suitable p-type impurity, such as boron. For example, the doped layer 260 may be formed by doping boron into the semiconductor fin 220 through the exposed surface of the recess 221. The doped layer 260 may be formed by an in-situ doping process. The doping process may include an implantation process to implant a p-type impurity, such as boron, into the semiconductor fin 220 through the exposed surface. The doped layer 260 may have a germanium atomic percentage profile L1 as shown in FIG. 4. This germanium atomic percentage profile can be achieved by, for example, controlling the ratio of the flow rate of the germanium-containing gas, such as $GeH_4$, to the flow rate of the silicon-containing gas, such as $SiH_4$. The doped layer 260 may have a boron concentration profile L6 as shown in FIG. 5. This boron concentration profile can be achieved by, for example, controlling the dose of the boron dopant used in the implantation process.

Figure 10B:
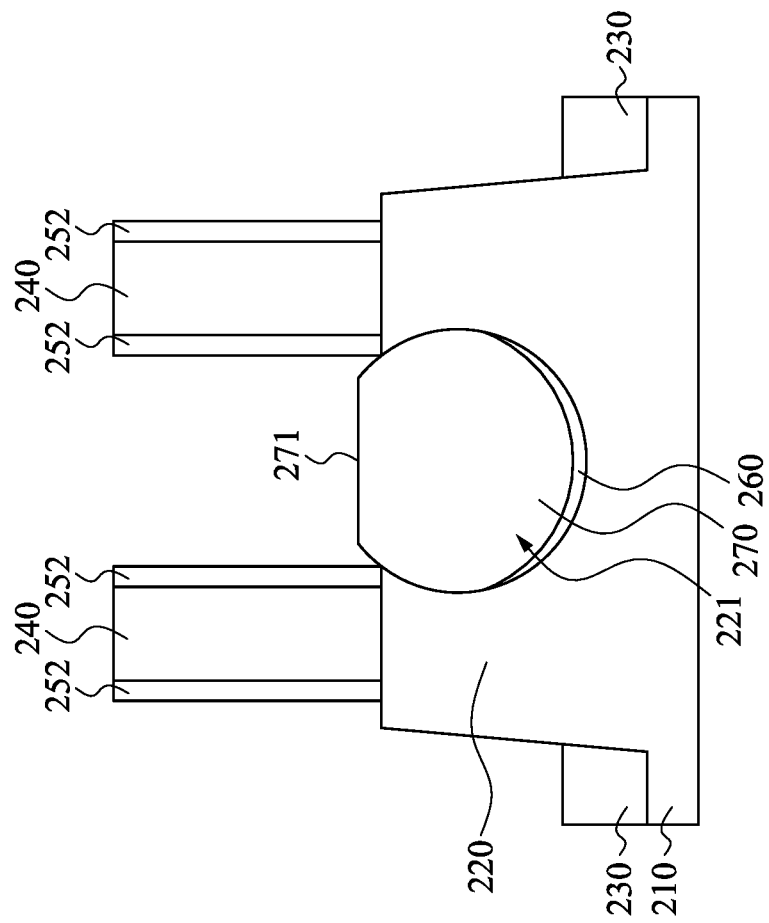
Figure 10A:
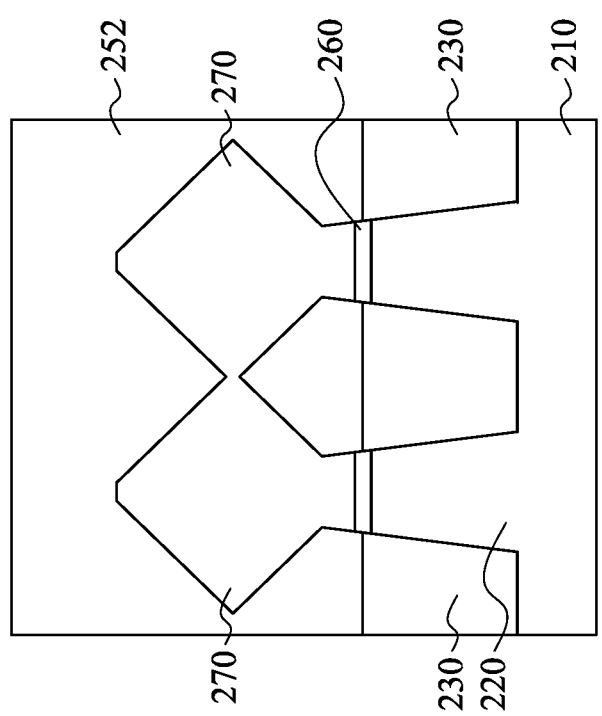

Reference is made to FIGS. 10A and 10B. A plurality of epitaxy structures 270 are respectively formed in the recesses 221 of the semiconductor fins 220 and over the doped layers 260. The epitaxy structures 270 may be formed using one or more epitaxy or epitaxial (epi) processes, such that Si features, SiGe features, and/or other suitable features can be formed in a crystalline state on the semiconductor fins 220. In some embodiments, the epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 220 (e.g., silicon).

The epitaxy structures 270 are germanium-containing structures. For example, the epitaxy structures 270 may include silicon germanium. The epitaxy structures 270 may be formed using chemical vapor deposition (CVD). The precursors may include silicon-containing gases and germanium-containing gases, such as $SiH_4$ and $GeH_4$, respectively, and the partial pressures of the silicon-containing gases and germanium-containing gases are adjusted to modify the germanium atomic percentage and the silicon atomic percentage. In particular, the ratio of the flow rate of the germanium-containing gas, such as $GeH_4$, to the flow rate of the silicon-containing gas, such as $SiH_4$, may be controlled or tuned to form the germanium atomic percentage profiles L2-5 as shown in FIG. 4 during the epitaxy growth of the epitaxy structures 270. Because epitaxial growth includes vertical growth and horizontal growth, a portion of one epitaxy structure 270 grown from the semiconductor fin 220 eventually merges with a portion of the epitaxy structure 270 grown from the neighboring semiconductor fin 220, in some embodiments. As such, the epitaxy structures 270 formed on different semiconductor fins 220 may be merged into a continuous epitaxy structure, which may benefit a source/drain contact to be formed thereon.

A doping process is performed to dope a suitable impurity into the epitaxy structure 270 to serve as a source region or a drain region of the semiconductor device. For example, the epitaxy structure 270 may be in-situ doped. The doping species include p-type dopants, such as boron or $BF_2$; n-type dopants, such as phosphorus or arsenic; and/or other suitable dopants including combinations thereof. If the epitaxy structure 270 is not in-situ doped, a second implantation process (i.e., a junction implant process) is performed to dope the epitaxy structure 270. The implantation may be performed to implant dopants into the epitaxy structure 270. One or more annealing processes may be performed to activate the epitaxy structure 270. The annealing processes include rapid thermal annealing (RTA) and/or laser annealing processes.

In some embodiments, a doping process is performed to unevenly dope boron dopants into the epitaxy structures 270, so that the boron concentration of the resulting epitaxy structures 270 is spatially various or unevenly distributed. In particular, the epitaxy structures 270 may have the boron concentration profiles L7-10 as shown in FIG. 5. For example, the dose of the boron dopants may be controlled or tuned to form the boron concentration profiles L7-10 as shown in FIG. 5 during the implantation process performed to the epitaxy structures 270. This may benefit top surfaces 271 of the epitaxy structures 270 formed in a suitable size and shape, so as to benefit the source/drain contact formed thereon.

Figure 11B:
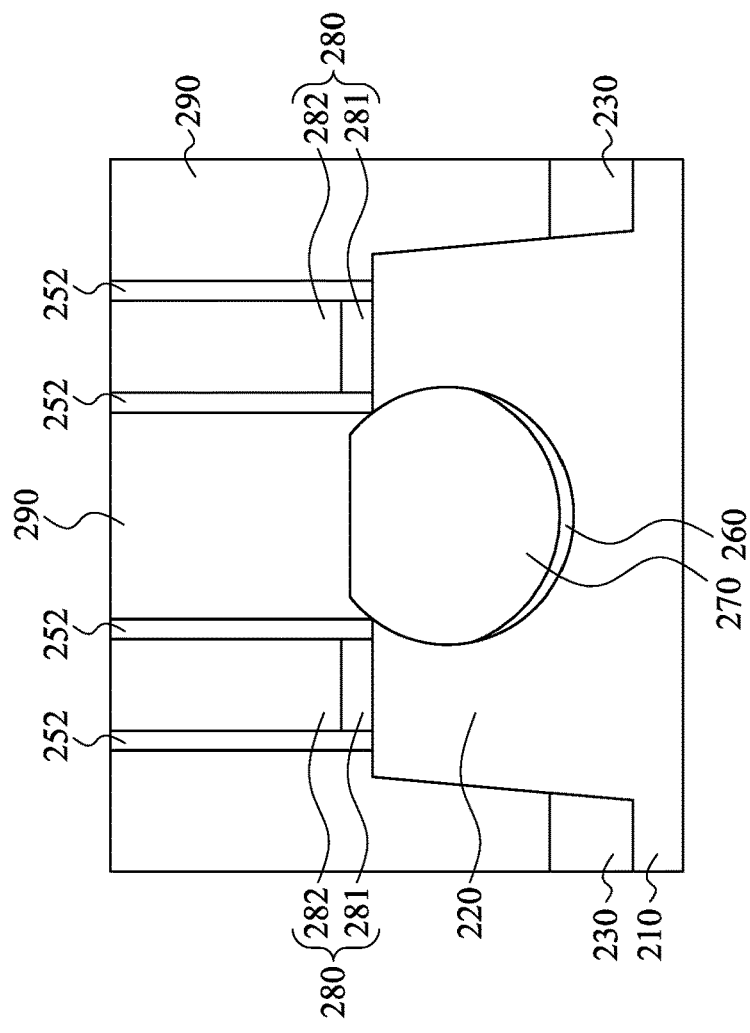
Figure 11A:
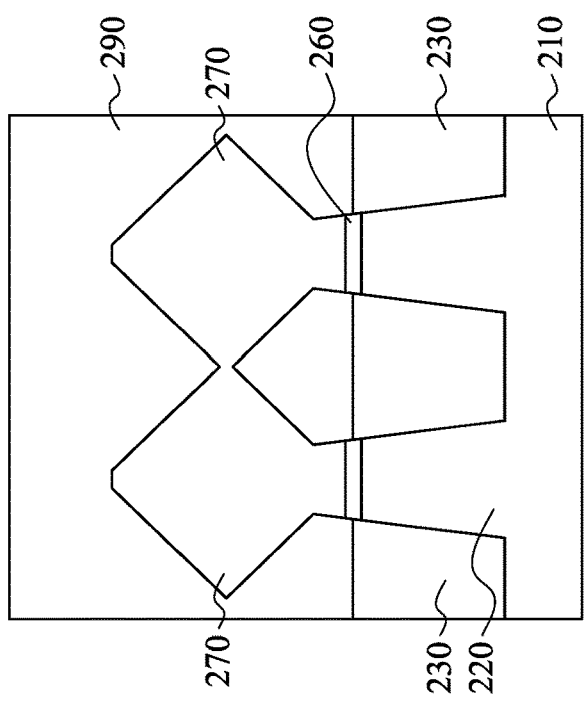

Reference is made to FIGS. 11A and 11B. A gate last process (or replacement gate process) is performed to replace the dummy gate structures 240 by the gate structures 280. The gate structures 280 may include a gate dielectric layer 281 and a gate electrode layer 282. The gate electrode layer 282 may include a work function metal. Providing the gate structures 280 later in the process can avoid problems of the stability of the work function metal during formation of the source/drain epitaxy structure 270. The gate last process may include removing the dummy gate structures 240 by an etching process, forming the gate dielectric layer 281 by a deposition process, forming a gate electrode layer 282 by a deposition process, forming a dielectric capping layer on the gate electrode layer 282 by a deposition process, and removing undesired portions of the dielectric capping layer by a CMP process.

Before removing the dummy gate structures 240, an interlayer dielectric (ILD) layer 290 is formed over the epitaxy structures 270. The ILD layer 290 includes silicon oxide, silicon nitride, silicon oxynitride, silicon carbide, low-dielectric constant dielectric material or a combination thereof. The ILD layer 290 can be formed by a deposition process, such as a CVD process.

Figure 12B:
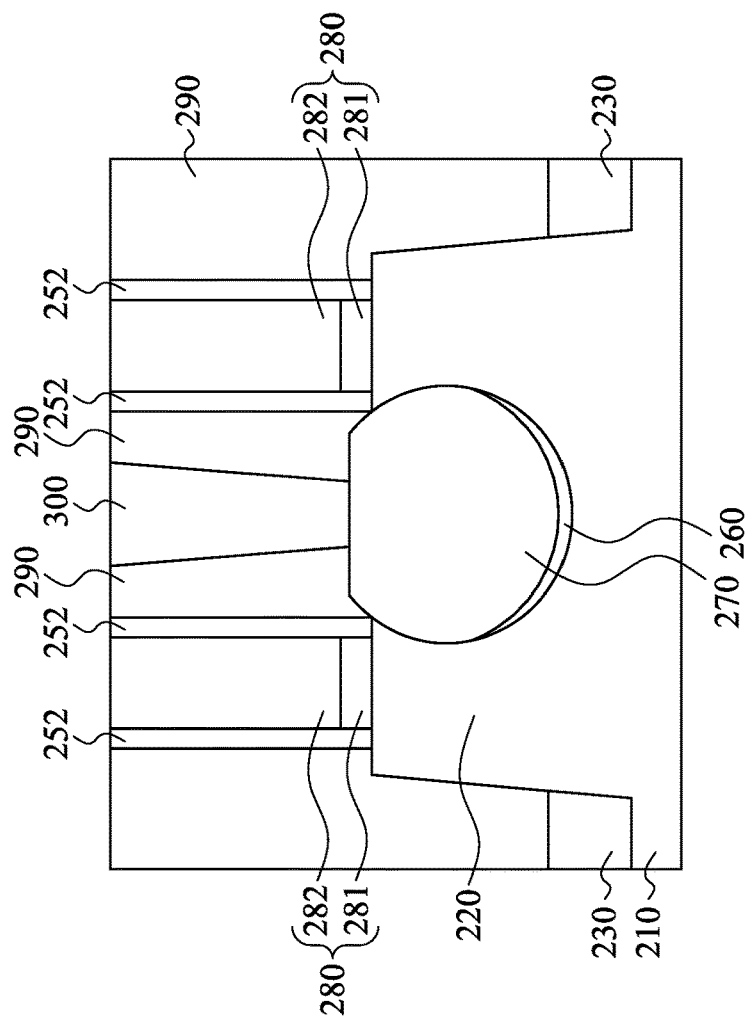
Figure 12A:
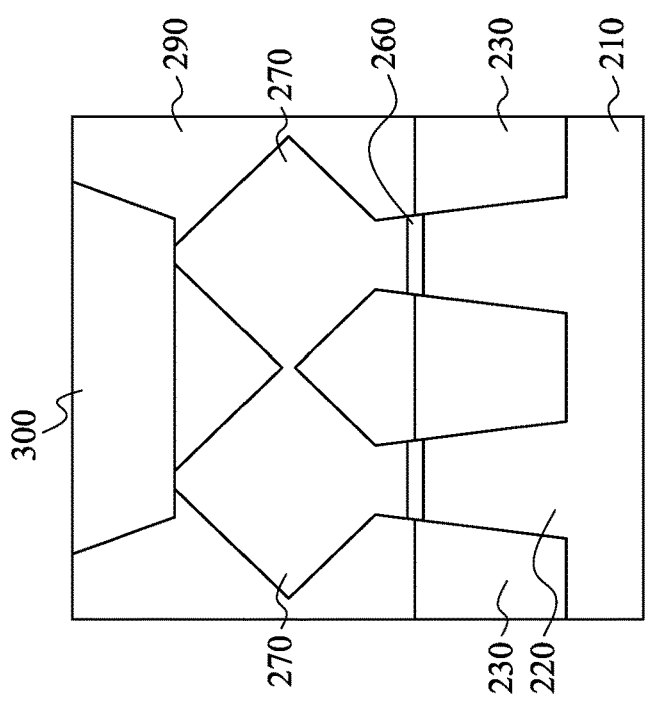

Reference is made to FIGS. 12A and 12B. A source/drain contact 300 is formed through the ILD layer 290 and contacts with the top surfaces 271 the epitaxy structures 270. Formation of the source/drain contact 300 may include forming contact holes by an etching process to etch through the ILD layer 290 down to the epitaxy structures 270 and depositing metal in the contact holes by a deposition process, such as a CVD process, to form the source/drain contacts 300.

In some embodiments, since the germanium atomic percentage profile and the p-type impurity concentration profile make the top surfaces of the epitaxy structures formed in a suitable size and shape, the source/drain contacts can be formed on the top surfaces more easily, and the contact resistance can be reduced as well.

According to some embodiments, a semiconductor device includes a substrate, at least one semiconductor fin, and at least one epitaxy structure. The semiconductor fin is present on the substrate. The semiconductor fin has at least one recess thereon. The epitaxy structure is present in the recess of the semiconductor fin. The epitaxy structure includes a topmost portion, a first portion and a second portion arranged along a direction from the semiconductor fin to the substrate. The first portion has a germanium atomic percentage higher than a germanium atomic percentage of the topmost portion and a germanium atomic percentage of the second portion.

According to some embodiments, a semiconductor device includes a substrate, at least one semiconductor fin, and at least one epitaxy structure. The semiconductor fin has at least one recess thereon. The epitaxy structure is present in the recess of the semiconductor fin. The epitaxy structure includes a topmost layer and a first gradient germanium-containing layer below the topmost layer. The first gradient germanium-containing layer has a germanium atomic percentage higher than a germanium atomic percentage of the topmost layer and increasing along a direction from the substrate to the semiconductor fin.

According to some embodiments, a method of forming a semiconductor device includes forming at least one semiconductor fin on a substrate, removing at least one portion of the semiconductor fin to form at least one recess, and forming at least one epitaxy structure in the recess of the semiconductor fin, wherein the epitaxy structure includes a topmost portion, a first portion and a second portion arranged along a direction from the semiconductor fin to the substrate, wherein a germanium concentration of the first portion is higher than a germanium concentration of the topmost portion and a germanium concentration of the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a semiconductor fin on a substrate, the semiconductor fin comprising a first material;
   forming a gate structure over the semiconductor fin;
   forming a recess within the semiconductor fin;
   implanting through the recess to form a doped layer within the semiconductor fin adjacent to the recess; and
   growing a second material different from the first material within the semiconductor fin, wherein after the growing the second material the second material comprises a first portion and a second portion extending in a direction downwards from a surface of the semiconductor fin towards the substrate, the second portion having a germanium concentration gradient opposite the first portion and the doped layer.

2. The method of claim 1, wherein the growing the second material further comprises:
   growing the second portion; and
   after the growing the second portion, modifying a ratio of reactant flow rates to grow the first portion.

3. The method of claim 1, wherein the growing the second material grows the second material with an impurity distributed through the second material.

4. The method of claim 3, wherein the growing the second material grows the second material with an uneven distribution of the impurity.

5. The method of claim 3, wherein the implanting to form the doped layer implants the impurity into the semiconductor fin such that the impurity oscillates along a first direction within the doped layer.

6. The method of claim 5, wherein the first direction is from the substrate to the semiconductor fin.

7. The method of claim 5, wherein the impurity is boron.

8. A method of manufacturing a semiconductor device, the method comprising:
   forming a semiconductor fin over a substrate;
   removing a portion of the semiconductor fin to form a rounded opening; and
   growing a material within the rounded opening of the semiconductor fin, wherein the growing the material further comprises:
      growing a first portion of the material with first reactants, wherein after the growing the first portion the first portion has a germanium concentration that increases a first time as a first distance from the substrate increases;
      modifying a first time at least one flow rate of the first reactants to grow a second portion of the material, wherein after the growing the second portion the second portion has a germanium concentration that decreases a first time as a second distance from the substrate increases;
      modifying a second time at least one flow rate of the first reactants to grow a third portion of the material, wherein after the growing the third portion of the material the third portion has a germanium concentration that increases a second time as a third distance from the substrate increases; and
   forming a doped layer in the substrate prior to the growing the material.

9. The method of claim 8, wherein the germanium concentration within the third portion is between about 25%-atomic and about 55%-atomic.

10. The method of claim 8, further comprising growing a fourth portion of the material, wherein the germanium concentration within the fourth portion of the material is between about 45%-atomic and about 55%-atomic.

11. The method of claim 8, wherein after the growing the material and after the forming the doped layer, a first dopant is located within the doped layer and the material, wherein the doped layer has an uneven distribution of the first dopant.

12. The method of claim 8, wherein the uneven distribution of dopants oscillates in a first direction.

13. The method of claim 8, wherein the growing the material grows the material until a portion of the material extends outside of the rounded opening.

14. A method of manufacturing a semiconductor device, the method comprising:
- forming a recess in a semiconductor fin;
- growing a first portion of a first material within the recess, wherein the growing the first portion increases a concentration of germanium being grown as the growing the first portion continues;
- growing a second portion of the first material within the recess, wherein the growing the second portion reduces the concentration of germanium being grown as the growing the second portion continues;
- growing a third portion of the first material within the recess, wherein the growing the third portion increases the concentration of germanium being grown as the growing the third portion continues; and
- forming a doped layer within the recess prior to the growing the first portion.

15. The method of claim 14, wherein the growing the second portion is performed by adjusting a partial pressure of a germanium-containing gas.

16. The method of claim 14, wherein the growing the third portion is performed by adjusting a partial pressure of a germanium-containing gas.

17. The method of claim 14, wherein the forming the doped layer comprises doping an impurity into the semiconductor fin.

18. The method of claim 14, wherein the impurity is boron.

19. The method of claim 8, wherein the impurity is boron.

20. The method of claim 14, further comprising growing a fourth portion of the first material, wherein the growing the fourth portion of the first material grows the fourth portion of the first material until the fourth portion of the first material extends outside of the recess.

* * * * *